(12) United States Patent
Zhang

(10) Patent No.: US 7,366,006 B2
(45) Date of Patent: Apr. 29, 2008

(54) SRAM WITH READ ASSIST

(75) Inventor: Yifei Zhang, Blaine, MN (US)

(73) Assignee: Honeywell International Inc., Morristown, NJ (US)

(*) Notice: Subject to any disclaimer, the term of this patent is extended or adjusted under 35 U.S.C. 154(b) by 123 days.

(21) Appl. No.: 11/401,679

(22) Filed: Apr. 11, 2006

(65) Prior Publication Data

US 2007/0236984 A1   Oct. 11, 2007

(51) Int. Cl.
*G11C 11/00* (2006.01)
(52) U.S. Cl. .................. 365/154; 365/156; 365/206; 365/194
(58) Field of Classification Search ............ 365/154, 365/156, 206, 194
See application file for complete search history.

(56) References Cited

U.S. PATENT DOCUMENTS 6,233,191 B1 *  5/2001  Gould et al. ............ 365/221
6,788,566 B1 *  9/2004  Bhavnagarwala et al. .. 365/154
7,200,031 B2 *  4/2007  Liu et al. ................ 365/154
7,233,518 B2 *  6/2007  Liu ....................... 365/156
2001/0010655 A1 *  8/2001  Manning ............... 365/230.03
2007/0242537 A1 * 10/2007  Golke et al. ............. 365/194

* cited by examiner

*Primary Examiner*—Viet Q. Nguyen
(74) *Attorney, Agent, or Firm*—McDonnell Boehnen Hulbert & Berghoff LLP

(57) ABSTRACT

A Static Random Access Memory (SRAM) matrix with a read assist is described. The read assist reduces the probability associated with an SRAM matrix becoming upset by a radiation event. Each SRAM cell within the SRAM matrix includes an active delay for increasing Single Event Upset (SEU) tolerance. The described SRAM matrix also includes a read assist coupled to each column of the SRAM matrix. The read assists store values associated with a row of SRAM cells, one SRAM cell of which is to be written to. If a radiation event occurs on any of the SRAM cells not being written to, the read assist restores an original value associated with the upset SRAM cell.

7 Claims, 5 Drawing Sheets

SRAM WITH READ ASSIST

FIELD

The present invention relates generally to the field of integrated circuit random access memories and more particularly to a radiation hardened SRAM matrix with a read assist for reducing upsets.

BACKGROUND

Static Random Access Memory (SRAM) is often used in the cache of a CPU and in digital processing circuits where speed is an important requirement. In contrast to Dynamic Random Access Memory (DRAM), SRAM is more tolerant to radiation events than capacitor based DRAM.

An SRAM matrix includes arrays of individual SRAM cells. Each SRAM cell is addressed and accessed so that it may be "read" from or "written" to. Each SRAM cell includes a pair of cross-coupled inventers that are each used to store either a "high" or "low" voltage level. The cross-coupled inverters are coupled with a pass gate, such as a transistor, that allows the cross-coupled inverters to be read from or written to. Unfortunately, in radiation environments, such as space and aerospace, these cross-coupled inverters and other transistors are susceptible to radiation events.

Because SRAM cells are made from semiconductor materials, such as silicon, a radiation event, such as a particle strike, may create a radiation induced charge. This charge, or glitch, if large enough, may cause a node within the cross-coupled inverters to inadvertently change state. If a glitch results in a bit-flip or a change in state of the SRAM cell, it is referred to as a Single Event Upset (SEU) or a soft error.

One method that circuit and system designers use to prevent radiation events from causing an SEU in an SRAM matrix is to introduce a delay element in the signal path of an SRAM cell. For example, one SRAM cell 10, in a six transistor configuration, is illustrated in FIG. 1A. SRAM cell 10 includes inverter 12 cross-coupled with inverter 14. Inverter 12 includes Field Effect Transistor (FET) 16 coupled with FET 18. Inverter 14 includes FET 20 coupled with FET 22. The coupled drains of FETs 16 and 18 are coupled to an active delay 24. The active delay 24 is coupled to the gates of FETs 20 and 22 and it is enabled and disabled by respective delay and bypass signals communicated at delay input 25.

The SRAM cell 10, in operation, is written to and read from by data (bit) lines 26 and 28, FETs 30 and 32 (pass gates), and enable (write) input 34. When SRAM cell 10 is to be read, an enable signal is communicated to enable input 34 and it is used to open a conduction path between the drain and source terminals of FETs 30 and 32. In addition, throughout the read, active delay 24 is enabled. The voltage stored by the cross-coupled inverters at nodes 36 and 38 is then communicated respectively to data lines 26 and 28. The voltages on data lines 26 and 28 are data signals, where the data signal on signal line 28 is an inverse of the data signal on signal line 26.

When the SRAM cell 10 is to be written to, the enable signal is communicated to enable input 34 and active delay 24 is disabled. Output drivers, also coupled to bit lines 26 and 28, are used to drive the voltages at nodes 36 and 38. For example, if the voltage at node 36 is "low" and a "high" value is to be written, a high voltage is communicated by the output driver to node 36. Node 36 drives the gates of FETs 20 and 22 so that a low voltage is produced at node 38. The low voltage at node 38 is used to drive the gates of FETs 16 and 18 so as to set the voltage at node 36 high. After the SRAM cell 10 is written, a disable signal may be communicated to enable input 34 and the SRAM cell 10 will store the voltage at nodes 36 and 38 until a write operation is performed again.

Without delay 24, the SRAM cell 10 would be more vulnerable to radiation events, including particle strikes. For example, if a glitch occurs on one of the nodes within SRAM cell 10, it could cause a glitch to propagate through the SRAM cell 10. An SEU may occur if the voltage stored at nodes 36 and 38 is inverted. The delay 24, however, prevents the SEU by driving a node that has been affected by a glitch back to its correct voltage level before the glitch is propagated through the delay 24.

An example of SEU prevention is demonstrated as follows. If the voltage at node 38 is low, for example, a glitch may cause the voltage at node 38 to go high. This high voltage will drive node 36 low. Delay 24, however, will continue to drive the gates of FETs 20 and 22 so that node 38 returns low. Delay 24 effectively delays the switching, or response time, of the cross-coupled inverters. If the response time is greater than the time it takes for the radiation induced charge to dissipate (i.e., the recovery time), the SRAM cell 10 has been effectively radiation hardened. When a delay signal is communicated to input 25, the response time of cross-coupled inverters 12 and 14 is increased. Alternatively, when a bypass signal is communicated to input 25, the response time is decreased. The bypass signal is generally used to decrease the delay of the SRAM cell 10 when it is being written to. The delay and bypass signals are used to optimize both the write speed and radiation hardness of the SRAM cell.

Active delay 24 generally includes elements that are used to increase or decrease the delay time of the cross-coupled inverters 12 and 14. For example, as shown in FIG. 1B, active delay 24 may include a FET 46 coupled with a resistance, such as a resistor 48. The FET 46 and resistor 48 may be coupled to receive the delay and bypass signals. When a bypass signal is communicated, the voltage at node 36 may be propagated through FET 46 (bypass path) to the gates of FETs 20 and 22. If a delay signal is communicated, however, FET 46 may close and the voltage at node 36 will be delayed for a finite amount of time by resistor 48 (delay path). The response time of the SRAM cell 10 may be tailored by adding additional elements to the delay or bypass paths of the active delay 24. For example, a capacitance may also be coupled with resistor 48.

Despite the effectiveness of current active delay schemes in current SRAM cells, however, current SRAM matrices bypass the active delays of multiple SRAM cells when a single SRAM cell is being written to. All of the SRAM cells in a particular row, for example, may have their active delay disabled when only one SRAM cell within the row is being written to. As a result, vulnerabilities to radiation events and other soft error phenomena still exist. Therefore, it would be desirable to design an SRAM matrix that reduces such vulnerabilities.

SUMMARY

A matrix of Static Random Access Memory (SRAM) cells and a method of operation are presented. The SRAM matrix includes SRAM cells that each have an active delay for maintaining upset, or radiation event tolerance. In addition, the SRAM matrix further includes read assists coupled to each column of the SRAM matrix. When an SRAM cell located in a row within the SRAM matrix is to be written to, the read assists store original data values with each SRAM cell within the row that is not being written to. In the event that a radiation event occurs, the read assist restores the affected SRAM cell back to a correct data value. The read assists may include an amplifier or a register for storing the original data values.

In another example, the SRAM matrix includes write logic circuitry which may be used to determine when a read assist should be activated. In some examples, read assists are activated prior to active delays being disabled. In other examples read assists are delayed subsequent to active delays being disabled.

In yet another example, a method of operating an SRAM matrix with read assists is described. The method includes "selecting" SRAM cells within a row that are not to be written to; storing an original data value associated with each selected SRAM cell; bypassing a switching delay associated with each SRAM cell located in the first row; and, restoring the upset SRAM cell with a stored data value that was originally stored on the upset SRAM cell.

These as well as other aspects and advantages will become apparent to those of ordinary skill in the art by reading the following detailed description, with reference where appropriate to the accompanying drawings. Further, it is understood that this summary is merely an example and is not intended to limit the scope of the claims.

BRIEF DESCRIPTION OF THE DRAWINGS

Certain examples are described below in conjunction with the appended drawing figures, wherein like reference numerals refer to like elements in the various figures, and wherein.

DETAILED DESCRIPTION

A Static Random Access Memory (Matrix) and method of operation are presented. The SRAM matrix includes a read assist register/amplifier coupled to each column within the SRAM matrix. Each SRAM cell within the SRAM matrix includes an active delay for preventing an upset. Such an upset may be caused by a radiation event, for example. When an SRAM cell located in a row within the SRAM matrix is not being written to, the active delay of each cell within the row not being written to is active. However, when any SRAM cell in the row is to be written to, the read assist stores a data value associated with each SRAM cell not being written to. The storing of the data value allows active delays of the row to be bypassed with a reduced risk of upset. If an upset does occur on an SRAM cell within the row, the read assist restores the value of the upset SRAM cell to the value that it had prior to the upset occurring.

Figure 2:
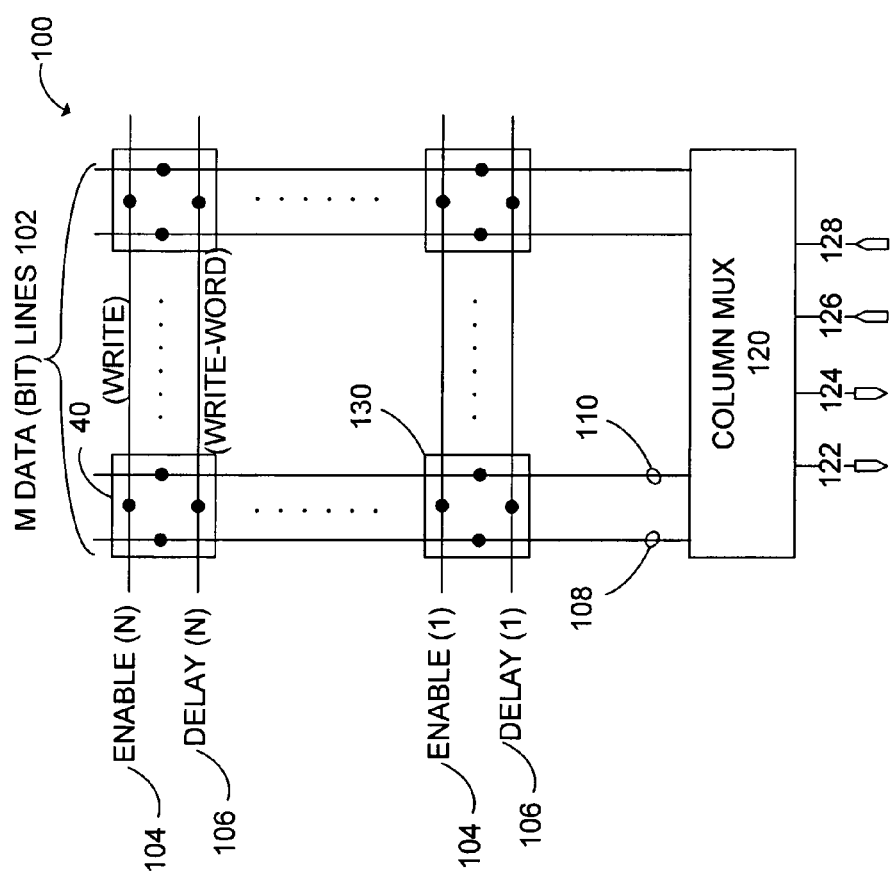
FIG. 2 is a circuit diagram of an SRAM matrix.

Turning now to FIG. 2, SRAM matrix 100 is constructed from a matrix of individual SRAM cells. A plurality of individual SRAM cells are used to construct an M×N matrix (comprising M columns and N rows). An individual SRAM cell is accessed for reading and writing by data (bit) lines (1-M) 102, enable (write) lines (1-N) 104, and delay (write word) lines (1-N) 106. The data lines 102 may be grouped in pairs so as to carry a data signal and an inverse data signal as shown respectively by data line 108 and 110.

Figure 1B:
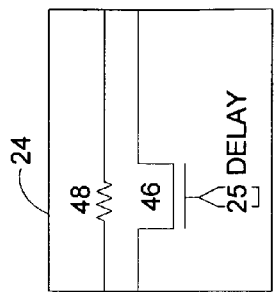
FIG. 1B is a circuit diagram of an active delay.
Figure 1A:
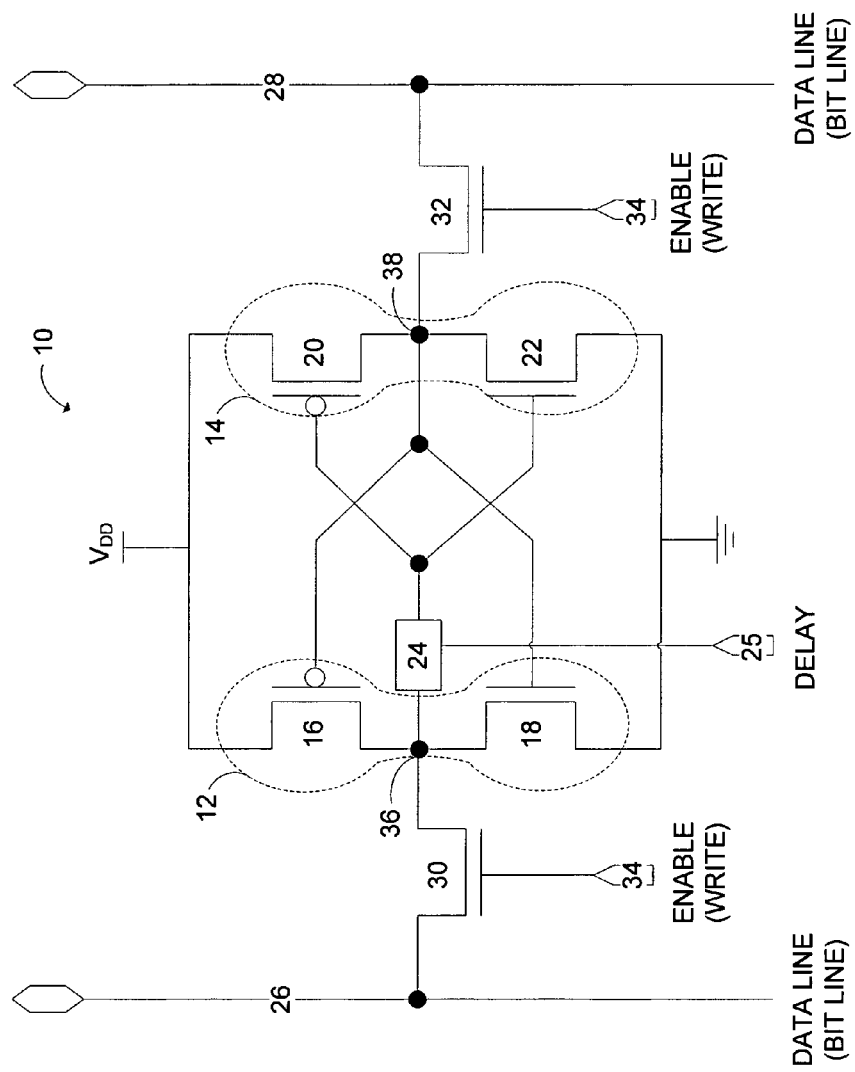
FIG. 1A is a circuit diagram of a Static Random Access Memory (SRAM) cell.

To provide access to an SRAM cell, data lines 102 access the columns of SRAM matrix 100. Enable lines 104 and delay lines 106 access the rows of SRAM matrix 100. Column Multiplexer (MUX) 120 may be used to select output data lines 122 and 124 from data lines 102. MUX 120 may also select input data lines 126 and 128 for writing an SRAM cell. Each SRAM cell provides reading and writing access by having nodes 36 and 38 (see FIG. 1A) respectively coupled to a pair of data lines via FETs 30 and 32. In addition, enable input 34 is coupled to an enable line and delay input 44 is coupled to a delay line.

If an SRAM cell is to be read from or written to its associated data lines and enable lines are selected. For example, if SRAM cell is to be read from or written to, the first column of SRAM matrix 100 would be selected via data lines 102 and MUX 120. The first row of SRAM matrix 100 would also be selected by an enable line located in the first row. SRAM cell 130 would therefore be singled out by the overlap of row 1 and column 1. Alternatively, if an SRAM cell located at the M-4 row and the N-2 column is to be written to or read from, the data lines corresponding to the N-2 column would be selected by MUX 120 and the enable line corresponding to the M-4 row would be selected, for example.

In general, when SRAM matrix 100 is in a standby state (i.e., it is not being written to), or it is only being read, all of the SRAM cells within SRAM matrix 100 receive a delay signal that indicates that the they are to be delayed. As described above, this delay maintains radiation hardness of the SRAM matrix 100.

Unfortunately, and as described above, the active delay of SRAM matrix 100 increases the response time of an SRAM cell and therefore decreases the overall speed of the SRAM matrix 100. This response time affects the speed of a memory by increasing the write time of an SRAM cell. (The speed of a read operation within SRAM matrix 100 is not affected by the response time because it does not require the cross-coupled inverters of an SRAM cell to change state). Therefore, a bypass signal should be received by SRAM cells that are being written to and not to those that are in a standby state or only being read. By using the bypass signal in this manner, the time penalty associated with using the active delay is reduced.

An additional example, not illustrated in FIG. 2, is an SRAM matrix that couples the enable line and the delay line of each row of an SRAM matrix together. This coupling decreases the complexity of such an SRAM matrix by essentially having a combined enable and bypass signal. In this configuration, however, a read and a write operation performed on a given SRAM cell will cause the SRAM cells in that row to have their active delays bypassed. Bypassing the active delay in both a read and a write would increase the exposure of an SRAM to upsets such as radiation induced glitches that may cause an SEU.

In contrast, only a single row within the SRAM matrix 100 is bypassed when an SRAM cell within the row is being written to. For example, if SRAM cell 130 is to be written to, only the first row of SRAM cells will have their active delays bypassed. Unfortunately, however, such a bypass of the entire row increases the probability of an upset of the SRAM cells within the row that are not being to. This increase in probability, therefore, also increases the probability of an upset of the entire SRAM matrix 100.

Figure 3:
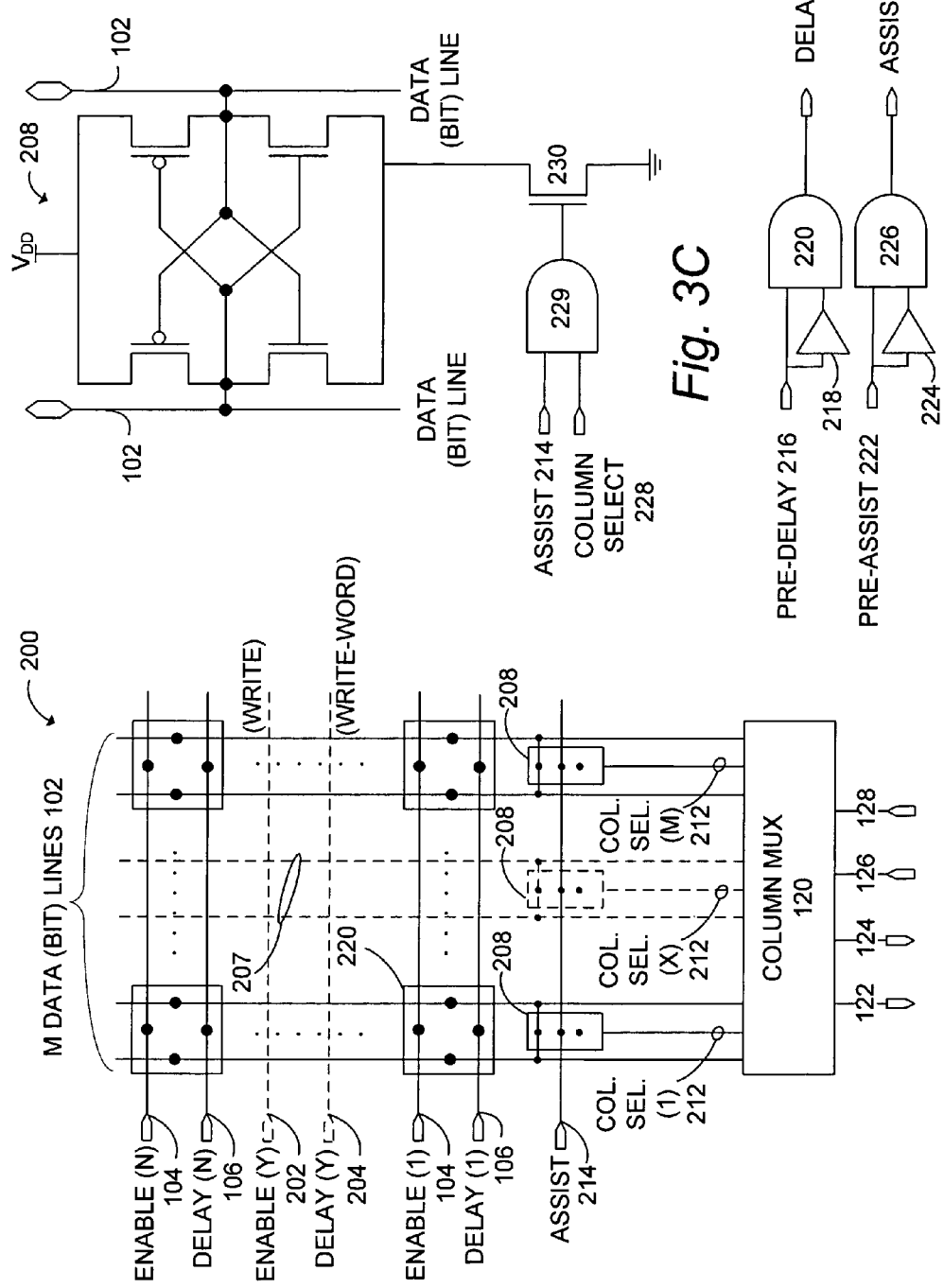
FIG. 3A is a circuit diagram of an SRAM matrix with a read assist coupled to each active column.
FIG. 3B is a circuit diagram of logic circuitry which may be used to determine when an activate and a bypass signal are to be communicated.
FIG. 3C is a circuit diagram of a read assist that includes an amplifier.

To reduce the probability of an upset due to bypassing the active delays of an entire row of SRAM cells, SRAM matrix 200 is presented in FIG. 3A. SRAM matrix 200 includes elements from SRAM matrix 100, namely data lines 102, enable lines 104, delay lines 106, MUX 120, output data lines 122 and 124, and input data lines 126 and 128. For purposes of illustration, a phantom enable line (Y) 202, a phantom delay line (Y) 204, and phantom data lines 207 are also shown. These phantom elements will further be described with reference to FIG. 5.

Also included in SRAM matrix 200 are read assists (1-M) 208. Each read assist is coupled to a column's associated data lines. Also coupled to each read assist are column select lines (1-M) 212 and assist line 214.

SRAM matrix 200 may be operated in a similar manner to that of SRAM matrix 100. The enable lines 104 may be used to select a row and a set of data lines 102 may be used to select a column. The overlap of the two determines which SRAM cell is selected to be accessed. Under normal operation, and as described above, a delay line associated with the selected row may maintain a delay signal on the selected row if the selected SRAM cell is to be read. If the selected cell is to be written, the associated delay line may communicate a bypass signal.

The SRAM matrix 200 prevents the remaining cells in the selected row from an upset by using the column select lines 212 and the assist line 214 to store the data of each SRAM cell in the selected row. For example, if SRAM cell 220 is to be written to, a read assist associated with each column will store the data associated with the first row of the SRAM matrix 200. Column selects 212 and assist 214 will be used to select all of the read assists except the read assist located in the first column. The column selects 212 may, for example, select each read assist that is to be activated and assist 214 may confirm that a read assist should take place. A signal from a column select line and a signal from assist 214 may be logically ANDed (further described with reference to FIG. 3C) to create an activate signal. The activate signal, when communicated to the read assist, may turn on, or activate, a read assist that it is communicated to. A variety of signals and combinations of signals may be used to create such an activate signal. It should be understood to a person skilled in the art that read assists 208 may be activated by an activate signal or other similar signals. For example, data lines 102 may be configured to communicate a signal that is used to activate read assists 208.

Depending on the implementation, a read assist may be activated, at the same time, or subsequent to a bypass signal being communicated to the selected row. Activating the read assist at a time subsequent to the bypass signal may allow a large enough voltage differential to exist across each set of data lines 102. Alternatively, activating the read assist prior to the bypass signal being communicated to the selected row may ensure that the data values in a selected row are stored prior to the active delays of the selected row being bypassed.

FIG. 3B illustrates example logic which may be used to delay a bypass signal and/or an activate signal. A pre-delay input 216 is coupled to a delay gate 218 and an AND gate 220 to produce a delayed bypass signal on delay line 106. Additionally, pre-assist input 222 may be coupled to a delay gate 224 and an AND gate 226 to delay a signal carried on assist 214. Delaying signal transmission on assist 214 will directly delay the activate signal. For example, delay times associated with delay gates 218 and 224 may be chosen so that the read assists 208 are activated prior to or subsequent to a bypass signal being communicated to a row. It should also be understood that the activate and bypass signals may be delayed in a variety of ways and are not limited to the example illustrated in FIG. 3B.

An example schematic that may be used for read assist 208 is illustrated in FIG. 3C. In this example, read assist 208 is an amplifier. Data lines 102, a column select line 228, and assist line 214 are coupled to the amplifier. Column select line 228 may be coupled to any one of column selects 212. In addition, column selects 212 may undergo a variety of logical operation before being communicated to column select 228 (e.g., inversion, delay, etc.).

The read assist is activated when AND gate 229 receives a high signal, or a binary value of 1, from both assist 214 and column select line 228. AND gate 229 outputs the activate signal to a gate associated with FET 230. Other combinations of signals from assist 214 and column select line 228 may be used to activate read assist 208. In addition, a variety of different types of write logic circuitry may be used to activate read assist 208. For example, instead of AND gate 229, alternative write logic could use column select line 228 exclusively to determine whether read assist 208 should be activated. Example signals used to activate read 208 assist will be further described with reference to FIG. 5.

Upon activation of read assist 208, data lines 102 communicate a high or low data signal, or data value, to the read assist 208. This data value is dependent upon the value stored at the particular SRAM cell that read assist 208 is in communication with. Because read assist 208 is coupled to each SRAM cell in a particular column of an SRAM matrix, the data signal will vary as different rows become enabled within the SRAM matrix. When read assist 208 is activated it will store the data value it receives. Generally, as described above, the SRAM cell that is communicating a data signal (via data lines 102) to the read assist 208 will have its associated active delay bypassed during a write to other cells located in its row, making it more vulnerable to an upset. If an SRAM cell in communication with read assist 208 does become upset, read assist 208 will drive the upset SRAM cell back to a correct voltage level or data value. If it does not become upset, read assist 208 may take no action.

In even further examples, read assist 208 may be a register or alternative type of memory element that stores data associated with each SRAM cell in a selected row. It should also be understood that the read assist as described in the above examples is also not limited to only being an amplifier or a register.

Figure 4:
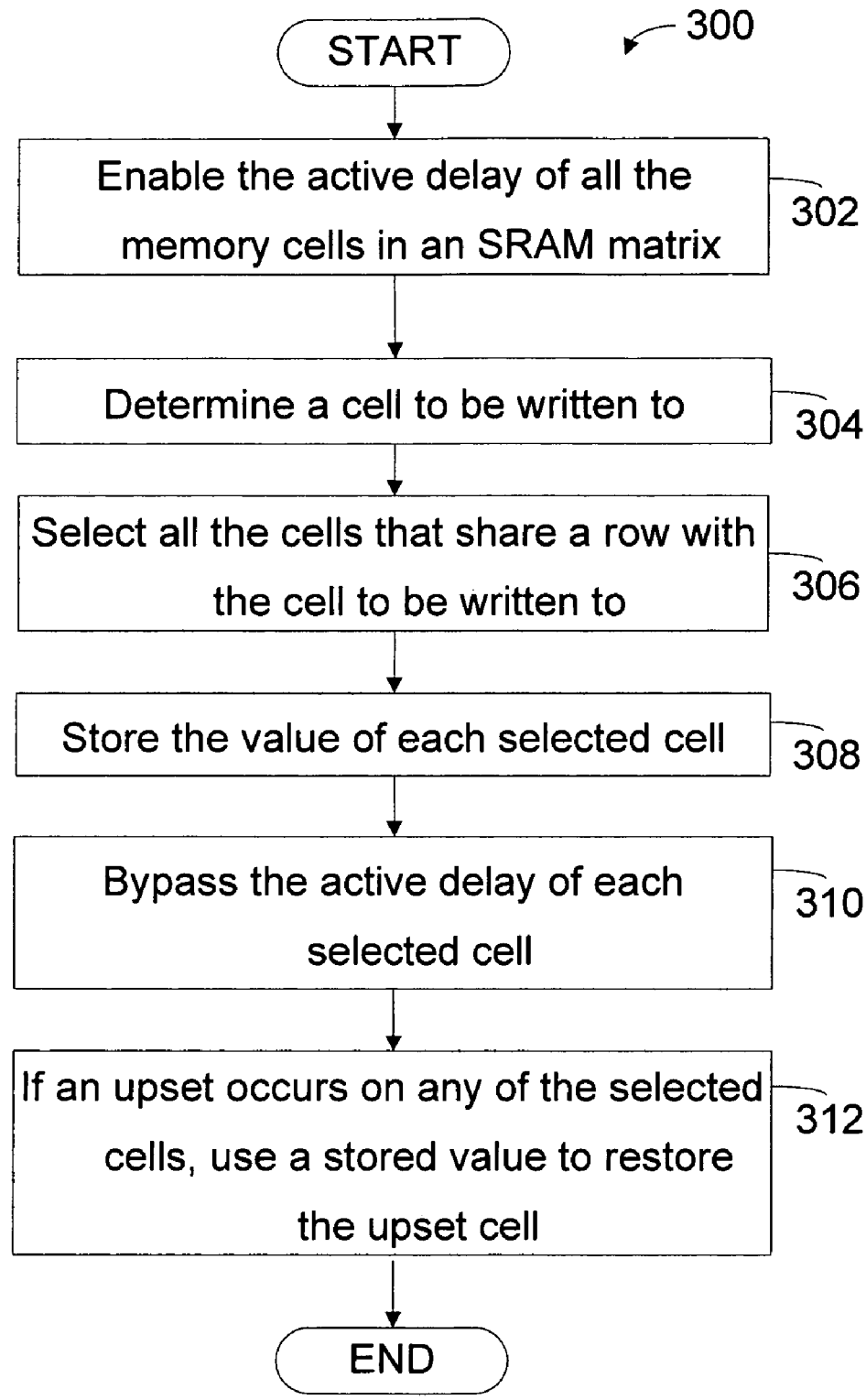
FIG. 4 is a flow diagram illustrating a method of operating the SRAM matrix of FIG. 3A.

To operate an SRAM matrix that implements a read assist, such as SRAM matrix 200, a method 300 of operating such a matrix is presented in FIG. 4. At block 302, the active delay of every SRAM cell in the SRAM matrix is enabled. An SRAM cell is then selected to be written to, as shown at block 304. All the SRAM cells that share a row with the selected SRAM cell are also selected, as shown at block 306. At block 308, the value of each selected SRAM cell is stored in a read assist. As shown in method 300, only the SRAM cells not being written to have their associated data values stored. In alternative examples the value of every SRAM cell, including the SRAM cell being written to, could be stored. Although not shown in method 300 or SRAM 200, the read assists are not limited to only storing data values of SRAM cells that are not being written to.

Once the values are stored in the read assists, the active delays of the entire row are bypassed, as shown at block 310.

As described above, and depending on the design of a particular SRAM matrix, block 310 may be performed prior to block 308. Method 300 is not limited by the order of the presented blocks. Finally, if an upset occurs on any of the cells not being written to, the read assist in communication with the upset SRAM cell restores a correct, or an original, data value to the SRAM cell.

Figure 5:
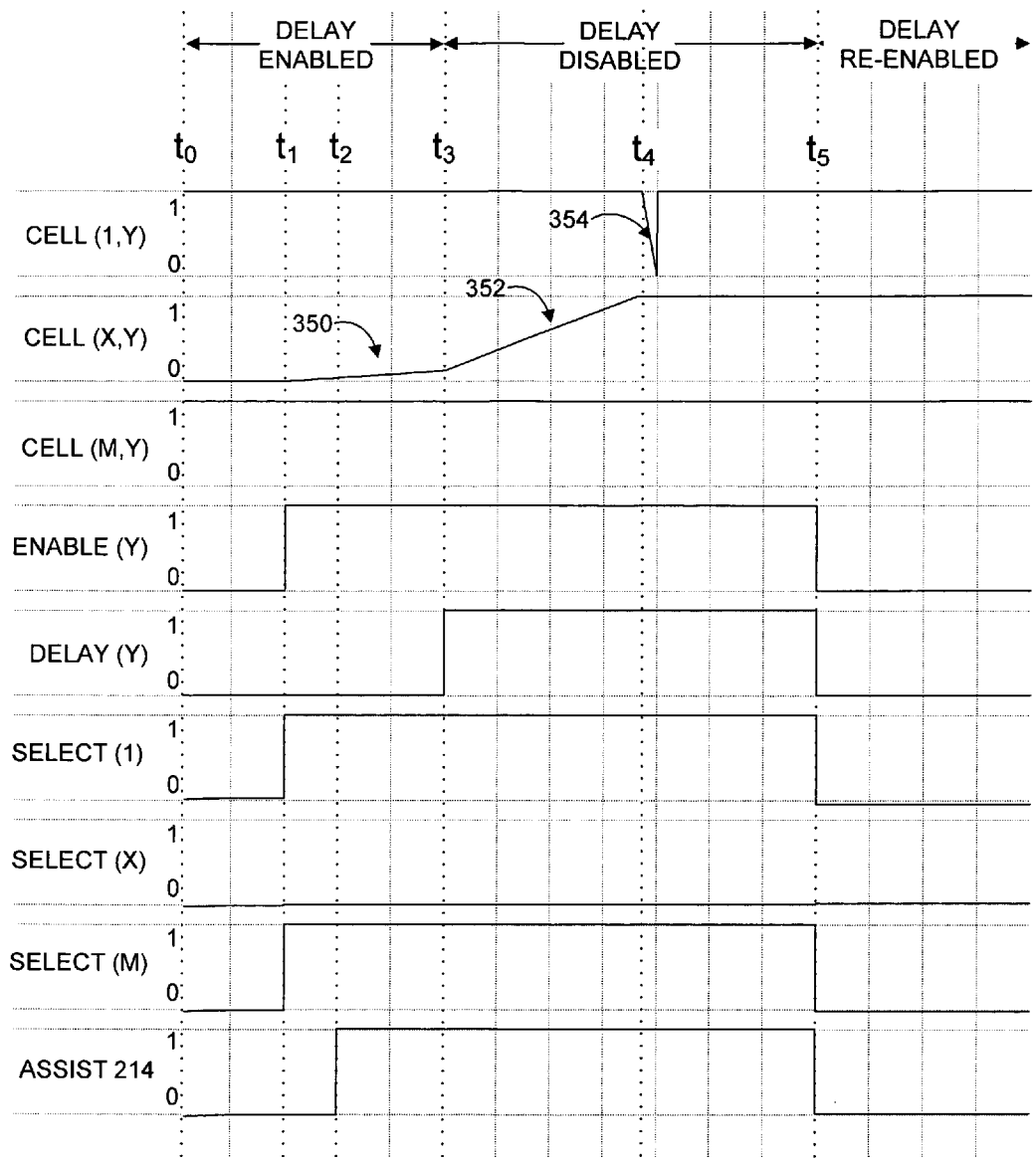
FIG. 5 is a timing diagram illustrating a write to the SRAM matrix of FIG. 3A.

A timing diagram illustrating a write using method 300 to operate SRAM cell 200 is presented in FIG. 5. In FIG. 5, three SRAM cells, SRAM cell (1,Y), (X,Y), and (M,Y), located in row Y and respective columns 1, X, and M each store a data value, or a bit. Enable line Y, corresponding to the enable line coupled to the SRAM cells located in row Y, communicates enable (binary value of "1") and disable (binary value of "0") signals. Select lines 1, X, and M determine which SRAM cells are to have their data values stored during the write. Delay line Y, corresponding to the delay line coupled to the SRAM cells located in row Y, communicates delay (binary value of 0) and bypass (binary value of 1) signals. Select lines 1, X, and M, along with assist 214 are used to activate the read assist associated with an SRAM cell. Again, the combination of the signals carried on the select lines and assist 214 may be viewed as an activate signal.

At time $t_0$, SRAM cells (1,Y) and (M,Y) each store a high voltage, or a binary value of 1. SRAM cell (X,Y) stores a low voltage, or a binary value of 0. Using the method 300 of FIG. 4, a write using a read assist is carried out and used to write a binary value of 1 to cell (X,Y). To carry this out, data lines, such as data lines 102, may be coupled to a pass gate associated with cell (X,Y).

At time $t_1$, an enable signal is communicated to each SRAM cell located in row Y. A data signal (having a binary value of 1) is communicated to SRAM cell (X,Y) and the voltage level of SRAM cell (X,Y) begins to increase (shown as slope 350). Because the active delay associated with SRAM cell (X,Y) is still enabled, slope 350 may be gradual (in comparison to when the active delay is disabled). Also shown at time $t_1$, select lines 1 and M communicate a binary value of 1 and select line X communicates a binary value of 0, thereby selecting SRAM cells not to be written to (as shown at block 306 of method 300).

At time $t_2$, assist 214 communicates a binary value of 1 to the read assists located in SRAM matrix 200. Using logic circuitry, such as AND gate 229 shown in FIG. 3C, the read assists associated with the SRAM cells not being written to are activated. The values of these cells are stored (not shown). Again, depending on the implementation of an SRAM matrix, the read assist may be activated at a variety of times.

At time $t_3$, delay line Y communicates a bypass signal. As a result, the voltage level of SRAM cell (X,Y) begins to increase rapidly (shown as slope 352). This is due to the active delay being bypassed and therefore decreasing the response time associated with the cross coupled inverters located in SRAM cell (X,Y).

At time $t_4$, a glitch 354 occurs at SRAM cell (1,Y). SRAM cell (1,Y)'s associated read assist, however, restores the value of the SRAM cell and prevents it from becoming upset. Glitch 354 may occur from a radiation event, such as a particle strike, for example.

At time $t_5$, select lines 1, X, and M return to a voltage level that deselects assist 214. In this example, when select lines 1, X, and M as well assist 214 are not being used they may return to a binary value of 0. Also occurring at time $t_5$, delay line Y and enable line Y return to a binary value of 0.

An SRAM matrix with a read assist along with a method of operation have been presented. It should be apparent that a read assist may be used with an SRAM matrix to prevent upsets of the SRAM matrix during a read operation. In particular, the read assist may be used to store the value of SRAM cells that share a row with an SRAM cell being written to. It should also be understood that the illustrated examples are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

I claim:

1. A matrix of Static Random Access Memory (SRAM) cells, comprising:
    first, second, third, and fourth SRAM cells each including an active delay and an associated pair of cross-coupled inverters, the active delay, in operation, increasing the response time of its associated pair of cross-coupled inverters;
    first and second delay lines for communicating delay signals, the first delay line coupled to the active delay of the first and second SRAM cells, the second delay line coupled to the active delay of the third and fourth SRAM cells; and
    first and second read assists for restoring an upset SRAM cell, the first read assist coupled to the cross-coupled inverters of the first and third SRAM cells, the second read assist coupled to the cross-coupled inverters of the second and fourth SRAM cells.

2. The SRAM matrix as in claim 1, wherein the first read assist is a first amplifier and the second read assist is a second amplifier.

3. The SRAM matrix as in claim 1, further comprising first and second data lines, the first data line coupling the first read assist to the first and third SRAM cells, the second data line coupling the second read assist to the second and fourth SRAM cells.

4. The SRAM matrix as in claim 1, wherein the first and second read assists are each coupled to receive an activate signal, the activate signal indicating that at least one of the first and second read assists are to store a data value associated with at least one of the first, second, third, and fourth SRAM cells.

5. The SRAM matrix as in claim 1, further comprising first and second enable lines for enabling a pass gate associated with each SRAM cell, the first enable line coupled to the first and second SRAM cells and the second enable line coupled to the third and fourth SRAM cells.

6. The SRAM matrix as in claim 1, further comprising write logic circuitry coupled to the first and second read assists, the write logic circuitry, in operation, communicating an activate signal to at least one of the first and second read assists subsequent to a bypass signal being transmitted on at least one of the first and second delay lines.

7. The SRAM matrix as in claim 1, further comprising write logic circuitry coupled to the first and second read assists, the write logic circuitry, in operation, communicating an activate signal to at least one of the first and second read assists prior to a bypass signal being transmitted on at least one of the first and second delay lines.

* * * * *